(12) United States Patent
Connell et al.

(10) Patent No.: US 7,751,792 B2
(45) Date of Patent: Jul. 6, 2010

(54) HIGHER LINEARITY PASSIVE MIXER

(75) Inventors: Lawrence E. Connell, Naperville, IL (US); David P. Kovac, Vernon Hills, IL (US); Poojan A. Wagh, Sleepy Hollow, IL (US); Vikram B. Karnani, Chicago, IL (US); William T. Waldie, Libertyville, IL (US); Tao Wu, Grayslake, IL (US)

(73) Assignee: Freescale Semiconductor, Inc., Austin, TX (US)

( * ) Notice: Subject to any disclaimer, the term of this patent is extended or adjusted under 35 U.S.C. 154(b) by 1360 days.

(21) Appl. No.: 11/086,045

(22) Filed: Mar. 22, 2005

(65) Prior Publication Data
US 2006/0217101 A1    Sep. 28, 2006

(51) Int. Cl.
*H04B 1/26* (2006.01)

(52) U.S. Cl. ............... 455/323; 455/326; 455/333; 327/355; 327/357; 327/359

(58) Field of Classification Search ......... 455/322–333, 455/127.3; 327/355–359; 375/308
See application file for complete search history.

(56) References Cited

U.S. PATENT DOCUMENTS

| | | | | |
|---|---|---|---|---|
| 3,765,020 A * | 10/1973 | Seeger et al. | | 342/195 |
| 5,668,842 A * | 9/1997 | Sorace et al. | | 375/308 |
| 6,342,804 B1 * | 1/2002 | Havens et al. | | 327/357 |
| 6,583,661 B1 * | 6/2003 | Tanji et al. | | 327/355 |
| 6,711,391 B1 * | 3/2004 | Walker et al. | | 455/234.1 |
| 6,985,036 B2 * | 1/2006 | Bhattacharjee et al. | | 330/254 |
| 7,236,763 B2 * | 6/2007 | Heck | | 455/323 |
| 2002/0173288 A1 * | 11/2002 | Shu | | 455/326 |
| 2004/0043741 A1 * | 3/2004 | Goddard et al. | | 455/313 |
| 2004/0136438 A1 * | 7/2004 | Fullerton et al. | | 375/130 |
| 2004/0137862 A1 * | 7/2004 | Tanaka et al. | | 455/127.3 |
| 2005/0043003 A1 * | 2/2005 | Abdelli | | 455/326 |
| 2005/0140405 A1 * | 6/2005 | Do et al. | | 327/143 |

OTHER PUBLICATIONS

Behzad, Arya R.; Shi, Zhong Ming; Anand, Seema Butala; Lin, Li; Carter, Keith A.; Kappes, Michael S.; Lin, Tsung-Hsien (Eric); Nguyen, Thinh; Yuan, Dan; Wu, Stephen; Wong, Y.C.; Fong, Victor; and Rofougaran, Ahmadreza. "*A 5-GHz Direct-Conversion CMOS Transciever Utilizing Automatic Frequency Control for the IEEE 802.11a Wireless LAN Standard*," IEEE Journal of Solid-State Circuits, vol. 38, No. 12, Dec. 2003.

Magoon, Rahul; Molnar, Alyosha; Zachan, Jeff; Hatcher, Geoff; and Rhee, Woogeun. "*A Single-Chip Quad-Band (850/900/1800/1900 MHz) Direct Conversion GSM/GPRS RF Transceiver with Integrated VCOs and Fractional-N Synthesizer*," IEEE Journal of Solid-State Circuits, vol. 37, No. 12, Dec. 2002.

* cited by examiner

*Primary Examiner*—Edward Urban
*Assistant Examiner*—Junpeng Chen
(74) *Attorney, Agent, or Firm*—Brinks Hofer Gilson & Lione

(57) ABSTRACT

Transmission of a high frequency signal is provided by a passive mixer. The passive mixer receives a low frequency signal as an input. The passive mixer includes a plurality of transistors each with a gate, a source, and a drain. The passive mixer also includes a local oscillator connected to the gates of the transistors. The gates of the transistors are also connected to a DC bias proportional to the threshold voltage of the transistors. In addition, an output of the passive mixer may be attenuated by a passive attenuator wherein both the passive attenuator and passive mixer are substantially free of quiescent current.

20 Claims, 6 Drawing Sheets

HIGHER LINEARITY PASSIVE MIXER

BACKGROUND

The present invention relates to signal frequency conversion.

Mobile cellular telephones communicate using radio frequency signals. Voice data input into a mobile cellular telephone microphone is a low frequency or baseband signal. A transmitter converts the baseband signal to a radio frequency signal for transmission by the mobile cellular telephone. The baseband signal is passed through a low frequency stage, converted to a radio frequency, and then passed through a high frequency stage. In one transmitter, a Cartesian approach to processing the baseband signal is used. Two low pass filters receive and filter baseband inphase (I) and quadrature (Q) signals. Baseband variable gain amplifiers scale the filtered I and Q signals. Two class A gilbert cell mixers up-convert the scaled I and Q signals to radio frequency I and Q signals. The radio frequency I and Q signals are summed into a single radio frequency signal. The summed radio frequency signal is then scaled by a class AB radio frequency variable gain amplifier. The scaled high frequency signal is finally passed to an antenna for transmission.

The transmitter incorporates baseband and radio frequency gain control for tradeoff between linearity, noise, local oscillator feedthrough, I/Q balance, and power consumption. For example, an existing transmitter may sacrifice power consumption to gain linearity. Both the low frequency stage and the high frequency stage include class A or class AB devices. In mobile cellular telephones, current and expected standards demand low noise, low current, high linearity, and more than 40 dB of power control.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE EMBODIMENTS

By way of introduction, the embodiments described below include a passive mixer with a plurality of transistors each with a gate, a source, and a drain. A local oscillator is connected to the gate of each transistor. A DC bias proportional to a threshold voltage is also connected to the gate of each transistor.

Figure 1:
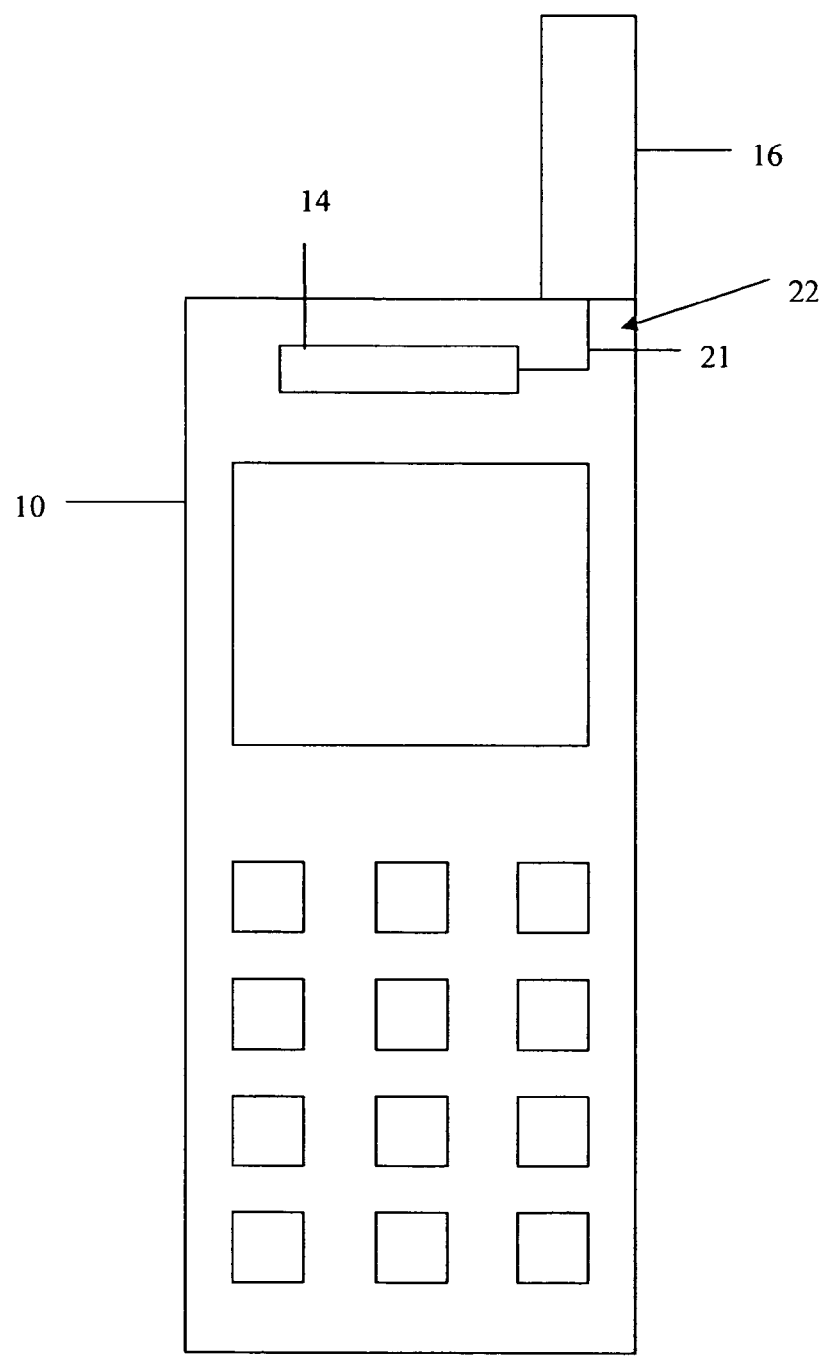
FIG. 1 is a diagram of one embodiment of a cellular phone with a high frequency transmission path connecting an integrated circuit with an antenna.

FIG. 1 shows one embodiment of a mobile telephone 10 with a high frequency path 22. The high frequency path 22 includes an antenna 16, a portion of an integrated circuit 14 for up-converting a low frequency signal to a high frequency signal, and a conductor 21 connecting the antenna 16 and integrated circuit 14. Additional, different, or fewer components may be provided. For example, the integrated circuit 14 could be implemented as an application specific integrated circuit, processor, digital signal processor, field programmable gate array, digital circuit, analog circuit, or combinations thereof.

The high frequency path 22 is a transmitter for operation pursuant to the Global System for Mobile (GSM) or Enhanced Data Rates for GSM Evolution (EDGE) specifications for cellular telephones. GSM operates using Gaussian Minimum Shift Keying (GMSK) while EDGE operates using 8 Phase Shift Keying (8-PSK). The 8-PSK used in EDGE places greater radio frequency performance requirements on the high frequency path 22. For example, higher linearity is desired because 8-PSK is more sensitive to nonlinear distortion.

Figure 2:
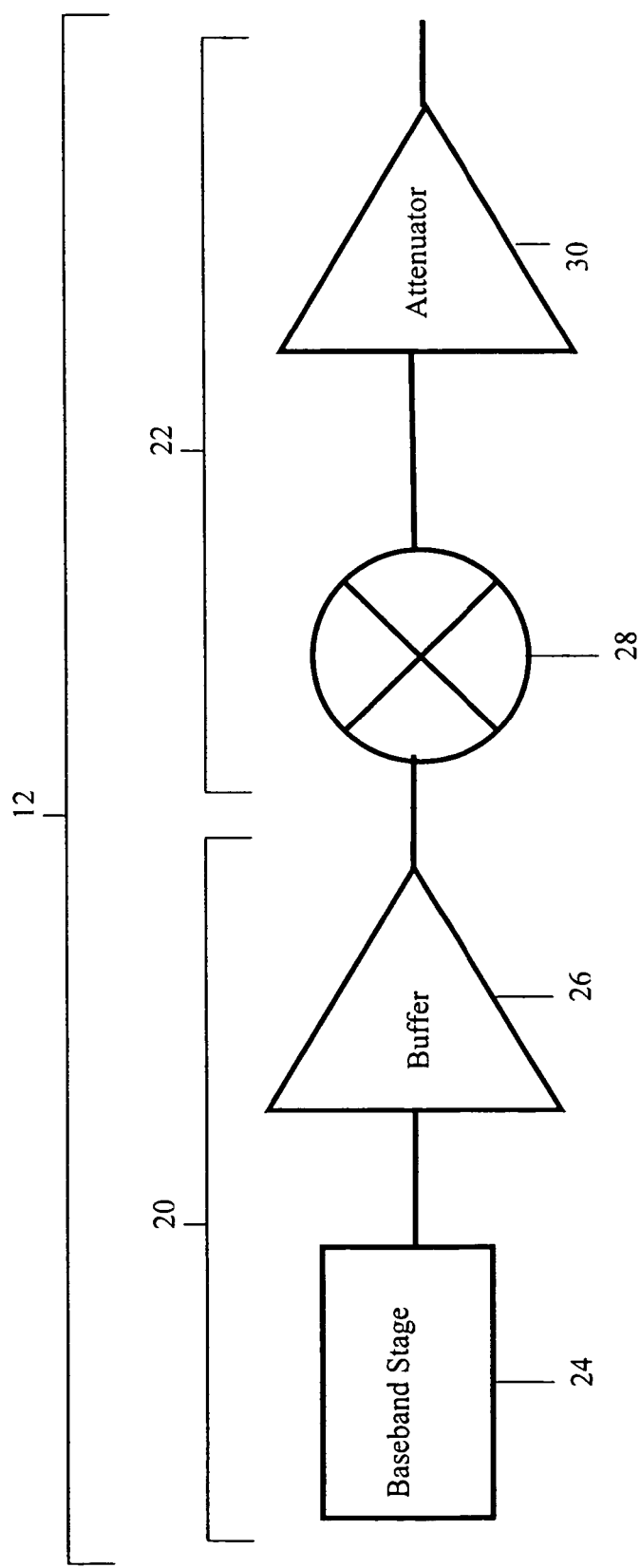
FIG. 2 is a block diagram of one embodiment of a transmit path.

FIG. 2 shows one embodiment of a transmit path 12. The transmit path 12 may be provided using a single signal path, a differential scheme with two signal paths, or some variation thereof. The transmit path may use a Cartesian or polar approach. The transmit path 12 includes both a low frequency path 20 and the high frequency path 22. The low frequency path 20 includes a baseband stage 24 and a buffer 26. The high frequency path includes a passive mixer 28 and a passive attenuator 30. Passive devices do not add or remove any signal current between their inputs and outputs. The transmit path 12 may include additional, different, or fewer components. For example, the transmit path 12 may include an intermediate frequency path in addition or in place of the low frequency path 20.

The low frequency path 20 receives a low frequency amplitude signal. The low frequency amplitude signal is input to the baseband stage 24. The low frequency amplitude signal is a baseband signal and may include voice or data from a mobile phone user. The baseband stage 24 provides the low frequency amplitude signal at a certain amplitude modulation level in order to comply with the EDGE specification. The amplitude modulation signal is input into the buffer 26. The buffer 26 is as an operational amplifier. The buffer 26 filters the amplitude modulated signal to remove high frequency noise. In addition, the buffer 26 may amplify the amplitude signal. The amount of quiescent bias current in the buffer output stage may be linearly scaled with the amplitude modulation level to save power. The quiescent bias current in the output stage of buffer 26 is being reduced since only lower output currents are demanded from it as the amplitude modulation level is reduced. The buffer output stage is a source follower stage. Further, linearity of the buffer output stage can be preserved by negatively feeding back the buffer stage output to the buffer input. Negative feedback preserves the linearity as the buffer output stage current is reduced proportional to the output amplitude level. This provides an advantage over the traditional active mixer approach which does not use negative feedback and its linearity is degraded as its current is reduced. In addition, an auto-zeroed comparator may be inserted at the buffer output to reduce carrier feedthrough in the buffer 26. Any offset in the baseband amplitude signal will be sent to the high-frequency path, will be modulated by the local oscillator, the carrier, and will appear at the output of the high-frequency path 22 as carrier feed-through. By auto-zeroing, the offset is minimized and therefore the carrier feed-through is minimized. The filtered signal is provided to the passive mixer 28, which is part of the high frequency path 22. The low frequency path 20 thereby provides a low frequency signal to the high frequency path 22.

The low frequency path 20 may include additional, different, or fewer components of any class. For example, the buffer 26 may be incorporated into the baseband stage 24. In addition, the baseband stage 24 or buffer 26 may provide two outputs, for use in a differential scheme, each 180° out of phase with each other.

The high frequency path 22 up-converts the signal for transmission by the antenna 16. The high frequency path 22 includes the passive mixer 28, the passive attenuator 30, and the antenna 16 shown in FIG. 2. Both the passive mixer 28 and the passive attenuator 30 employ passive switches, such that the high frequency path 22 between and including the passive mixer 28 and the passive attenuator 30 operates with substantially no quiescent current. In one embodiment, a polar approach is used in the high frequency path 22, which does not require summing of I (in-phase) and Q (quadrature) signals at radio frequency. Consequently, only a single mixer is used in the high frequency path 22. The high frequency path 22 may include additional, different, or fewer passive or active components. For example, the high frequency signal may be output directly to the antenna 16 from the passive mixer 28, eliminating the passive attenuator 30. In addition, the high frequency path 22 may include an amplification stage after the passive attenuator 30 to conform to the GSM and EDGE specifications. Additional passive components between the passive mixer 28 and passive attenuator 30 are contemplated as well.

Class A and class AB devices are typically used to provide the high linearity desired in mobile cellular phone specifications. However, class A devices require substantial current to maintain the high linearity and low noise requirements for the EDGE specification. Class A and class AB devices draw quiescent current while in a quiescent or unused state. In other words, class A and A/B devices may draw a similar amount of current whether there is an input signal or not. Class B and class C devices draw less quiescent current while the device is in its quiescent state. However, class A, A/B, B, and C devices are not as efficient as class D, E, or F devices because class D, E, or F devices draw substantially no quiescent current while in a quiescent state.

The high frequency path 22 may draw less current than a high frequency path using a class A approach in some situations. For example, 40 mA of current reductions over a class A approach may be provided. In one embodiment, the high frequency path 22, including mixer 28 and variable gain attenuator 30, draws about 26 mA of current compared to the class A approach which draws 62 mA of current in their highest output power state. Greater or lesser amounts of current draw may be provided.

The passive mixer 28 and passive attenuator 30 are designed to handle a total broadband resistive output impedance of about 50 Ohms. The baseband buffer has a negligible output impedance of about 2 ohms. The passive mixer 28 provides about 25 ohms, and the passive digital gain variable attenuator 30 provides about 25 ohms. The DC bias circuit described below enables small low power transistors to efficiently provide the 25 ohm output impedance required for the passive mixer 28. The proper output impedance ensures the intended frequency response. Greater or lesser amounts of output impedance may be provided.

Figure 3:
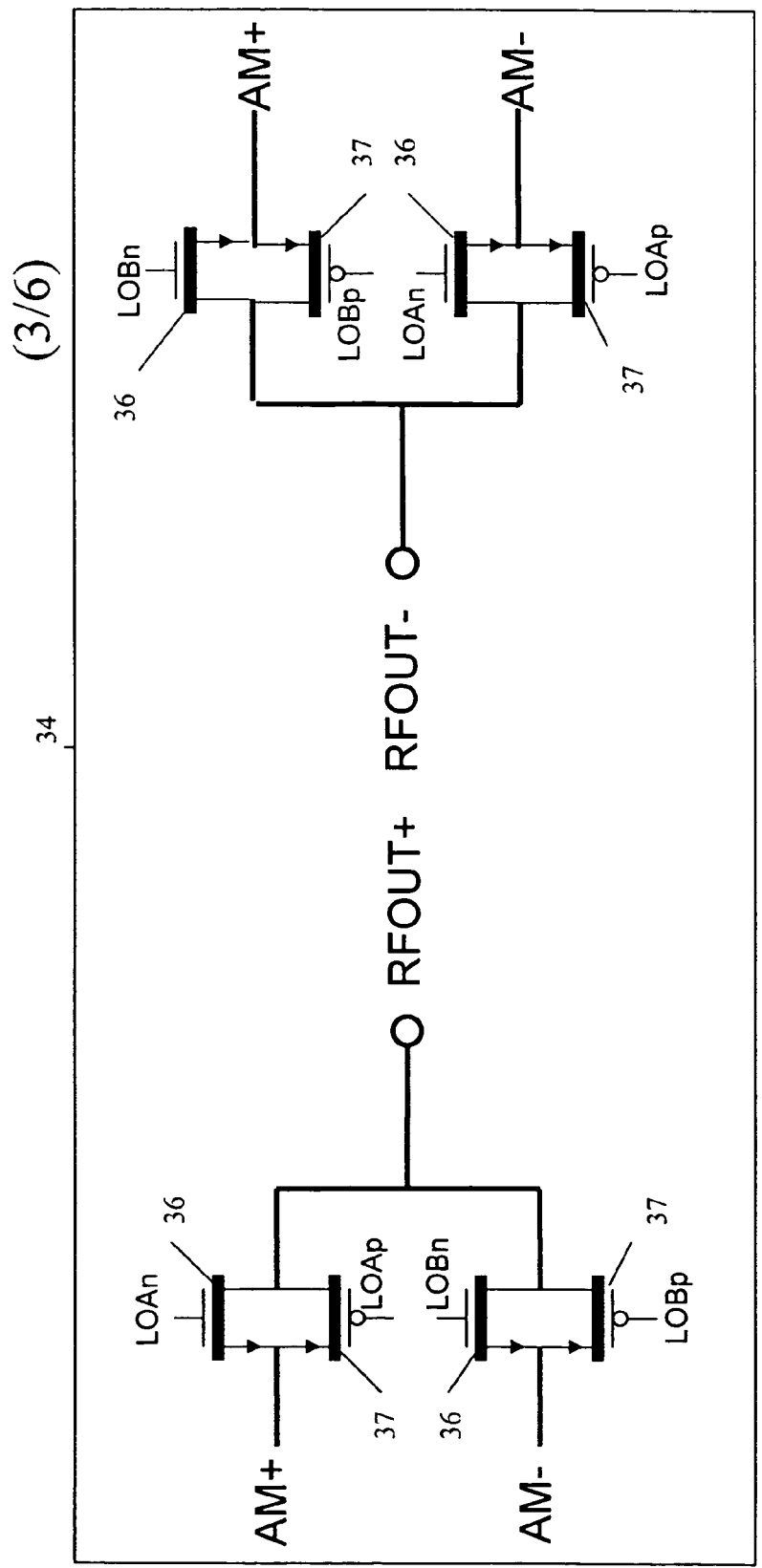
FIG. 3 is a circuit diagram of one embodiment of a passive mixer.

The passive mixer 28 may be implemented as a passive class D switching mixer 34, shown in FIG. 3. The passive class D switching mixer 34 provides efficient conversion from baseband or low frequency to high frequency. The passive class D switching mixer 34 comprises a plurality of N-Channel Metal Oxide Semiconductor Field Effect Transistors 36 (n-FETs) and a plurality of P-Channel Metal Oxide Semiconductor Field Effect Transistors 37 (p-FETs). Each of the n-FETs 36 and p-FETs 37 has a drain, source, and gate. Each n-FET is paired with a p-FET to create four Complementary Metal Oxide Semiconductor (CMOS) transmission gates. For clarity's sake, two CMOS gates are described, however the other two CMOS gates work in a similar manner. The first CMOS gate's source is connected to a baseband signal AM+, while the second CMOS gate's source is connected to a baseband signal AM−, 180° out of phase with AM+. Both CMOS gates' drains are connected together as a single output, RFOUT+. The n-FET's gate of the first CMOS gate is connected to LOAn, and the p-FET's gate of the first CMOS gate is connected to LOAp. The n-FET's gate of the second CMOS gate is connected to LOBn and the p-FET's gate of the second CMOS gate is connected to LOBp. The generation of LOAn, LOAp, LOBn, and LOBp is discussed below with reference to FIG. 4. Each CMOS gate of the transistors 68 and 70 is connected to a node (biasN and biasP respectively) connected to a resistor and a capacitor connected to a local oscillator signal which control whether the source passes through to the drain. The passive class D switching mixer 34 mixes the AM+ signal and AM− signal together to provide RFOUT+. The gates of n-FETs 36 and p-FETs 37 allow the AM+ signal to pass through as the RFOUT+ signal while the AM− signal is not allowed to pass as the RFOUT+ signal. When the gates allow the AM− signal to pass as the RFOUT+ signal, the AM+ signal is not allowed to pass as the RFOUT+ signal. The RFOUT− signal is generated in a similar manner. This switching configuration generates two outputs, the RFOUT+ signal and the RFOUT− signal, 180° out of phase with each other. The RFOUT+ signal and RFOUT− signal are amplitude modulated, phase modulated, radio frequency signals.

In another embodiment, the passive mixer 28 accepts two inputs, an AM+ baseband signal and an AM− baseband signal, but outputs a single radio frequency signal. In yet another embodiment, one input of the mixer 28 is an AM baseband signal and another input is connected to a voltage source. The output in this embodiment is a single radio frequency signal. The passive mixer 28 may comprise additional, different, or fewer components. For example, a transformer coupled mixer is used in place of a passive class D switching mixer 34. In another example a passive class E or class F mixer is used in place of a passive class D switching mixer 34.

In a FET, when a threshold voltage is achieved between the gate and source, the signal is allowed to pass from source to drain. The threshold voltage varies based on the transistor's fabrication and operating temperature. The amount of voltage applied exceeding the threshold voltage is called the overdrive voltage. The amount of overdrive voltage determines the nonlinearity characteristics of a transistor and its resistance. A large and constant overdrive voltage is generated to enable a small low power FET to provide a low on resistance with a small parasitic capacitance and high linearity characteristics. The large and constant overdrive voltage is achieved when a high voltage potential DC bias proportional to an n-FET threshold voltage is applied to the gate of an n-FET and when a low voltage potential DC bias proportional a p-FET threshold voltage is applied to the gate of a p-FET. The DC bias for the n-FETs is equal to a voltage potential which is higher than the DC bias voltage potential for the p-FETs.

Figure 4:
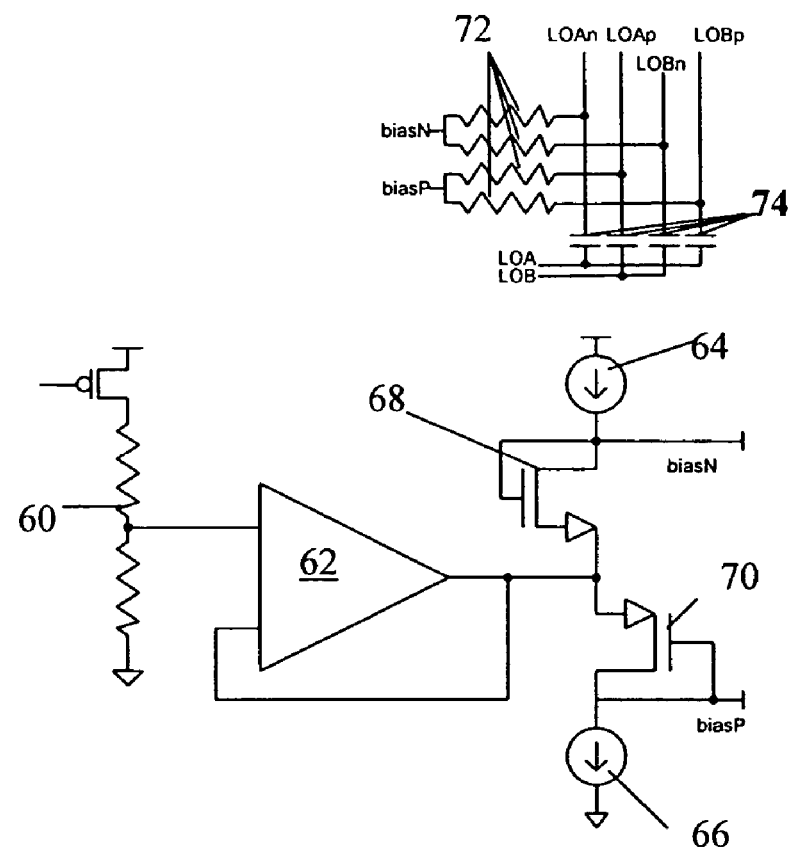
FIG. 4 is a circuit diagram of one embodiment of a DC bias circuit.

FIG. 4 shows one embodiment of a circuit capable of generating a DC bias proportional to the threshold voltage of a transistor. A resistive divider 60 generates a DC voltage and an operational amplifier 62 buffers the DC voltage. The buffered DC voltage is equal to the common mode voltage of the passive mixer 28 input. The operational amplifier 62 output is connected to the source of an n-FET 68 and the source of a p-FET 70. The current source 64 generates a fixed current for both the gate and drain of the n-FET 68. The current source 66 generates a fixed current for both the gate and drain of the p-FET 70. This configuration generates two DC voltages, biasN and biasP. BiasN is a node including the common mode voltage and the threshold voltage of n-FET 68. BiasP is a node including the common mode voltage and the threshold voltage of p-FET 70. BiasN and biasP connect with different ones of a plurality of resistors 72. The resistors 72 have the same or different resistances.

LOA and LOB are generated by a local oscillator (not shown) and are 180° out of phase with each other. LOA and LOB connect with different ones of a plurality of capacitors 74. The capacitors 74 have the same or different capacitances. Each one of the resistors 72 connects with one of the capacitors 74 to form a node. This generates a total of four different nodes LOAn, LOAp, LOBn, and LOBp connected to the gates of the passive class D switching mixer 34 as described above. Each node includes a local oscillator signal and a DC bias proportional to the threshold voltage of the p-FET or n-FET being controlled. The threshold voltage determined from n-FET 68 and p-FET 70 is similar to the threshold voltage of n-FETs 36 and p-FETs 37 respectively because they share the same operating temperature, fabrication run, and fabrication method. These four nodes more likely ensure large and constant overdrive voltage, hence low resistance with high linearity characteristics, in each of the n-FETs 36 and p-FETs 37 in the passive class D switching mixer 34 shown in FIG. 3. In addition, this threshold independent biasing technique ensures that two CMOS gates which drive the same output node are not on at the same time.

In one embodiment, the input of the passive class D switching mixer 34 is distorted to compensate for the constant nonlinearity characteristics of the device. Passive devices are typically nonlinear, but may act linear under certain conditions. One such condition is where the baseband input is pre-distorted to compensate for the nonlinearity. The amount of distortion necessary to compensate for the nonlinearity is based on the nonlinearity characteristics of the transistors in the passive mixer 28. The DC bias circuit described above makes the nonlinearity characteristics threshold independent, allowing for the pre-distortion of input to be fixed. For example, in one embodiment a $2^{nd}$ order coefficient is added at the baseband stage 24 to compensate for the nonlinearity characteristics of the passive mixer 28.

Figure 5:
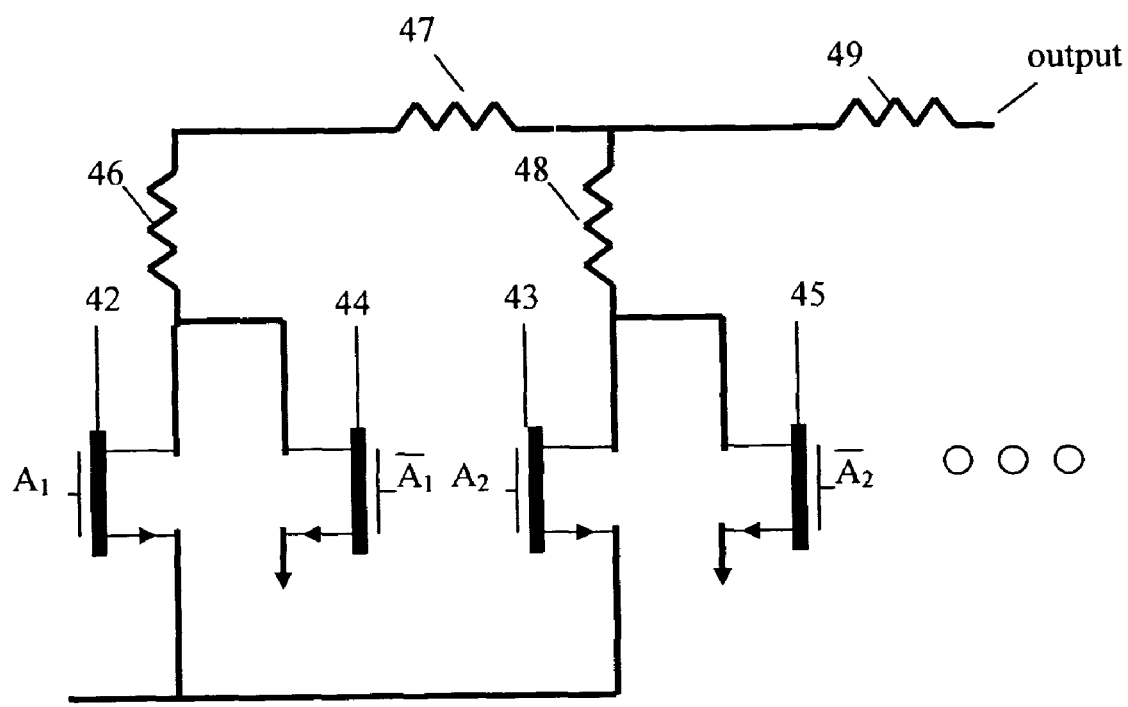
FIG. 5 is a circuit diagram of one embodiment of an attenuator.

The attenuator 30 is a digital variable gain attenuator (DVGA). For example, a passive R-2R ladder architecture is used as shown in FIG. 5. The R-2R ladder architecture includes a plurality of resistors 46-49 connected in parallel or series. The resistors 46-49 have the same or different resistances. The number of resistors in parallel or series is dependent on how many attenuation steps are desired. The number of resistors connected to the signal path is dependent on which of the n-FETs are active. Each source of the n-FETs 42-43 is connected to the input, each drain is connected to the plurality of resistors 46-49 and a corresponding n-FET 44, and each gate is resistively connected to a separate digital signal. Each source of the n-FETs 44-45 is connected to a fixed voltage (analog ground), each drain is connected to the plurality of resistors 46-49 and a corresponding n-FET 42, and each gate is connected to a complementary digital signal of the one connected to the gate of the corresponding n-FET 42-43. A set amount of power control may be provided by choosing which n-FETs are active. For example, where n-FET 42 is active and n-FET 44 is inactive and n-FET 43 is inactive and n-FET 45 is active the input current would pass through resistors 46 and 47, and split between resistor 48, which connects to ground, and resistor 49, which connects to the output. After an amount of attenuation is implemented, an output signal is provided for transmission. The R-2R ladder architecture provides substantially constant output impedance, low noise, and high linearity. Separate R-2R ladder architectures receive respective ones of the two high frequency signals as inputs. The attenuator 30 may include additional, different, or fewer components. For example, p-FET devices may be used in place of n-FETs. In another example a switched resistive network may be used instead of an R-2R ladder structure. In another example a passive class D, class E, or class F attenuator is used instead of an R-2R ladder structure. In addition, the gate drives of the switches within the R-2R are resistively coupled in the on-state. This allows their voltage to track with the input in the on-state. In the off-state, they are connected to ground which allows them not to track with the input and ensures that they remain off.

Figure 6:
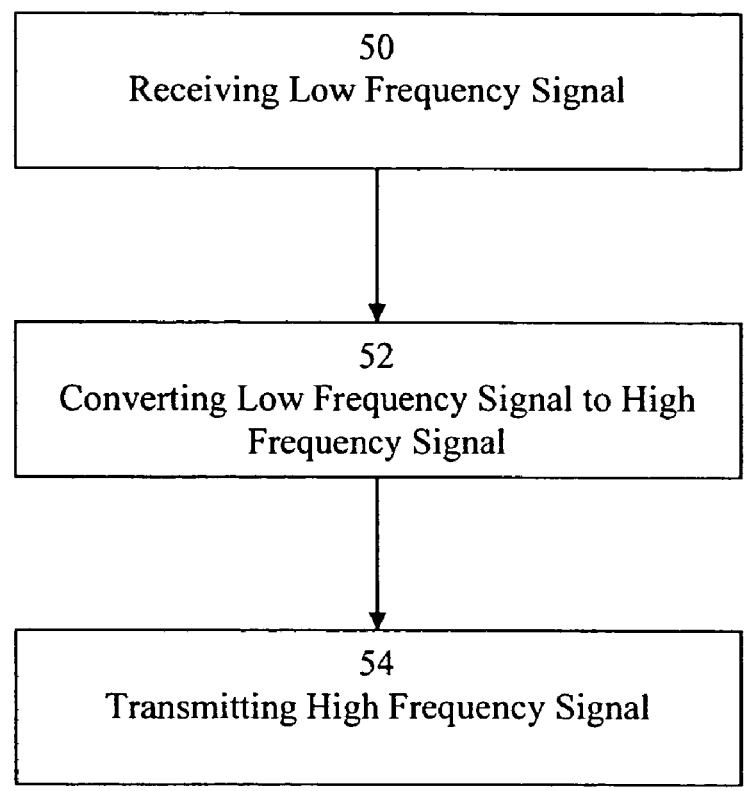
FIG. 6 is a flowchart of one embodiment of a method for transmitting a high frequency signal.

FIG. 6 shows one embodiment of a method for transmitting with substantially large and constant overdrive voltage. The method is implemented using the high frequency path 22 of FIG. 2 or a different path. Additional, different, or fewer acts may be provided than shown in FIG. 6. For example, an additional act of processing the high frequency signal may be provided.

In act 50, a pre-distorted low frequency signal is received. The pre-distorted low frequency signal includes voice or data information. In one embodiment, the low frequency signal is a baseband signal, but may be a partially up-converted (i.e. intermediate) signal in other embodiments. The low frequency signal is received from a speaker, a processor, a low frequency path, a baseband stage or other component for up-conversion to a radio frequency.

In act 52, the low frequency signal is converted to a high frequency signal, such as an amplitude and phase modulated radio frequency signal. A passive mixer, such as a passive class D switching mixer up-converts the received low frequency signal to a high frequency signal. The up-converting is done by components with large and constant overdrive voltage. A passive attenuator, such as an R-2R ladder structure, attenuates the high frequency signal with a variable and selectable amount of attenuation. An amplification stage may amplify the high frequency signal to meet a cellular telephone specification, such as GSM or EDGE.

In act 54, the high frequency signal is transmitted. Transmission is accomplished via an antenna and according to the GSM or EDGE specifications for cellular telephones. The antenna receives and transmits the scaled high frequency While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A passive mixer comprising:
   a plurality of transistors each with a gate, a source, and a drain;
   a local oscillator; and
   a high voltage potential DC bias comprising a common mode voltage of an input of the passive mixer, the high voltage potential DC bias proportional to a threshold voltage of said plurality of transistors;
   wherein said gate is connected to said local oscillator and said high voltage potential DC bias, and wherein said plurality of transistors comprises a plurality of n-field effect transistors connected to said high voltage potential DC bias and a plurality of p-field effect transistors connected to a low voltage potential DC bias.

2. The passive mixer of claim 1 wherein each of said source is connected to a baseband buffer.

3. The passive mixer of claim 1 wherein each of said drain is connected to an R-2R ladder or switched resistive network.

4. The passive mixer of claim 2 wherein an output of the baseband buffer is connected to an auto-zeroed comparator.

5. The passive mixer of claim 1 wherein each of said source accepts a baseband signal and wherein each of said drain provides an amplitude modulated, phase modulated, radio frequency signal.

6. The passive mixer of claim 1 wherein said local oscillator generates two signals 180° out of phase with each other.

7. The passive mixer of claim 1 wherein said transistors have a substantially constant overdrive voltage.

8. The passive mixer of claim 1 wherein said transistors have substantially constant nonlinearity characteristics.

9. A transmitter comprising the passive mixer of claim 1, the transmitter comprising an input for receiving a low frequency signal and a passive attenuator operative to attenuate a high frequency signal.

10. The passive mixer of claim 1 wherein each of said source accepts a low frequency signal and each of said drain provides a high frequency signal.

11. The passive mixer of claim 1 wherein the passive mixer is substantially free of quiescent current.

12. The passive mixer of claim 1 wherein the passive mixer comprises a passive class D switching mixer or a transformer coupled mixer.

13. The passive mixer of claim 1 wherein the passive mixer comprises a passive class E or class F mixer.

14. A passive mixer comprising:
    a plurality of n-field effect transistors each with a gate, a source, and a drain;
    a plurality of p-field effect transistors each with a gate, a source, and a drain;
    a local oscillator;
    a high voltage potential DC bias comprising a common mode voltage of an input of the passive mixer, the high voltage potential DC bias proportional to a threshold voltage of said plurality of n-field effect transistors;
    a low voltage potential DC bias comprising the common mode voltage of the input of the passive mixer, the low voltage potential DC bias proportional to a threshold voltage of said plurality of p-field effect transistors;
    wherein each of said n-field effect transistor gates are connected to said local oscillator and said high voltage potential DC bias; and
    wherein each of said p-field effect transistor gates are connected to said local oscillator and said low voltage potential DC bias.

15. The passive mixer of claim 14 wherein the source of each of the plurality of n-field effect transistors is connected to a baseband buffer and the source of each of the plurality of p-field effect transistors is connected to the baseband buffer.

16. The passive mixer of claim 15 wherein an output of the baseband buffer is connected to an auto-zeroed comparator.

17. The passive mixer of claim 14 wherein the drain of each of the plurality of n-field effect transistors is connected to an R-2R ladder or switched resistive network and the drain of each of the plurality of p-field effect transistors is connected is connected to the R-2R ladder or the switched resistive network.

18. The passive mixer of claim 14 wherein the source of each of the plurality of n-field effect transistors and the plurality of p-field effect transistors accepts a baseband signal and wherein the drain of each of the plurality of n-field effect transistors and the plurality of p-field effect transistors provides an amplitude modulated, phase modulated, radio frequency signal.

19. A transmitter comprising the passive mixer of claim 14, the transmitter comprising an input for receiving a low frequency signal and a passive attenuator operative to attenuate a high frequency signal.

20. A passive mixer comprising:
    a plurality of transistors each with a gate, a source, and a drain;
    a local oscillator; and
    a first DC bias comprising a common mode voltage of an input of the passive mixer, the first DC bias proportional to a threshold voltage of said plurality of transistors;
    wherein said gate is connected to said local oscillator and said first DC bias,
    wherein the source is connected to a baseband buffer and an output of the baseband buffer is connected to an auto-zeroed comparator.

* * * * *